（12） United States Patent
Park et al.

(10) Patent No.: US 8,228,755 B2
(45) Date of Patent: Jul. 24, 2012

(54) WORD LINE DRIVING CIRCUIT AND METHOD

(75) Inventors: Hyun-Ho Park, Hwaseong-si (KR);
Young-Yong Byun, Seoul (KR);
Yamada Satoru, Seould (KR)

(73) Assignee: Samsung Electronics Co., Ltd.,
Suwon-Si (KR)

( * ) Notice: Subject to any disclaimer, the term of this patent is extended or adjusted under 35 U.S.C. 154(b) by 262 days.

(21) Appl. No.: 12/695,213

(22) Filed: Jan. 28, 2010

(65) Prior Publication Data

US 2010/0202241 A1 Aug. 12, 2010

(30) Foreign Application Priority Data

Feb. 6, 2009 (KR) .................. 10-2009-0009741

(51) Int. Cl.
*G11C 7/00* (2006.01)
(52) U.S. Cl. .................. 365/230.06; 365/230.08
(58) Field of Classification Search ............. 365/230.06, 365/230.08, 206
See application file for complete search history.

(56) References Cited

U.S. PATENT DOCUMENTS 5,455,789 A * 10/1995 Nakamura et al. ....... 365/185.17
7,499,366 B2 * 3/2009 Scheuerlein et al. ..... 365/230.06
2004/0160850 A1 * 8/2004 Son ........................ 365/230.06
2006/0176758 A1 * 8/2006 Chun ...................... 365/230.06
2007/0121417 A1 * 5/2007 Morzano et al. ......... 365/230.06

FOREIGN PATENT DOCUMENTS

| JP | 10-312682 | 11/1998 |
|---|---|---|
| JP | 11-144458 | 5/1999 |
| JP | 2001-195879 | 7/2001 |

OTHER PUBLICATIONS

M. Koyanagi et al., 'Investigation and Reduction of Hot Electron Induced Punchthrough (HEIP) Effect in Submicron Pmosfets, 1986 IEEE, pp. 722-725.
Seung-Moon Yoo et al., "Variable Vcc Design Techniques for Battery Operated DRAMs", 1992 Symposium on VLSI Circuits Digest of Technical Papers, 1992 IEEE, pp. 110-111.

* cited by examiner

*Primary Examiner* — Vu Le
(74) *Attorney, Agent, or Firm* — F. Chau & Associates, LLC (57) ABSTRACT

A word line driving circuit includes an address decoding signal generating unit and a word line voltage supply unit. The address decoding signal generating unit includes inverter chain receiving and delaying a first address decoding signal and outputting the delayed first address decoding signal. The word line voltage supply unit includes a pull-up driver that supplies the delayed first address signal to a selected word line in response to a second address decoding signal. The inverter chain includes an NMOS transistor outputting the delayed first address signal and a source terminal of the NMOS transistor receives a set voltage that is higher than a ground voltage and lower than a high voltage.

16 Claims, 7 Drawing Sheets

FIG. 7

WORD LINE DRIVING CIRCUIT AND METHOD

CROSS-REFERENCE TO RELATED APPLICATIONS

This application claims priority to Korean Patent Application 10-2009-0009741, filed on Feb. 6, 2009, in the Korean Intellectual Property Office, the disclosure of which is incorporated by reference herein.

BACKGROUND

1. Technical Field

Exemplary embodiments of the inventive concept relate to a semiconductor memory device, and more particularly, to a circuit and method for driving a word line of a semiconductor memory device.

2. Discussion of Related Art

As the degree of integration and the processing speed of semiconductor memory devices increases, a high voltage used in the semiconductor memory device has an increasing affect on the reliability of the semiconductor memory device. Maintaining the high voltage at a constant operating level may improve the reliability of the semiconductor device. For example, when the high voltage exceeds its operating level, the level of the high voltage needs to be reduced, and when the high voltage drops below its operating level (e.g., due to leakage current), the level of the high voltage needs to be increased.

A circuit for driving the word lines of the semiconductor memory device may include a pull-up driver having a PMOS transistor that supplies a high voltage to a selected word line. When testing the reliability of a semiconductor memory device that frequently accesses one word line, pulses may be continuously applied to a source electrode of the PMOS transistor. However, such testing may cause electrons to be trapped within the PMOS transistor leading to a phenomenon known as hot electron induced punch-through (HEIP). Due to HEIP, current can flow in the PMOS transistor even when a voltage is not applied to the transistor's gate. Accordingly, a leakage current may be generated that reduces the driving capability of the word line driving circuit.

When a high-level voltage is applied to the gate of the PMOS transistor and a low-level voltage is applied to the source and drain thereof, a gate induced drain leakage (GIDL) phenomenon may occur. A leakage current (hereinafter, referred to as a GIDL current) generated by the GIDL phenomenon may reduce the driving capability of the word line driving circuit.

Thus, there is a need for a word line driving circuit that is less affected by the HEIP or GIDL phenomena and a method of driving the word line driving circuit.

SUMMARY

A word line driving circuit according to an exemplary embodiment of the inventive concept includes an address decoding signal generating unit and a word line voltage supply unit. The address decoding signal generating unit includes an inverter chain receiving and delaying a first address decoding signal and outputting the delayed first address decoding signal. The word line voltage supply unit includes a pull-up driver that supplies the delayed first address signal to a selected word line in response to a second address decoding signal. The inverter chain includes an NMOS transistor outputting the delayed first address signal and a source terminal of the NMOS transistor receives a set voltage that is higher than a ground voltage and lower than a high voltage.

The inverter chain may include a PMOS transistor, where a source terminal thereof receives the high voltage. The inverter chain may include another NMOS transistor, where a source terminal thereof receives the ground voltage. The set voltage may include a bit line voltage or an internal power supply voltage.

The inverter chain may include a first driver receiving and inverting the first address decoding signal and outputting the inverted signal of the first address decoding signal, and a second driver receiving and inverting the inverted signal to output the delayed first address decoding signal.

The word line driving circuit may further include a floating driver applying the delayed first address decoding signal to the word line voltage supply unit in response to the inverted signal. The address decoding signal generating unit may further include a third driver that receives and inverts the first address decoding signal and applies the inverted signal of the first address decoding signal to the floating driver. The floating driver may include a PMOS transistor. The word line driving circuit may further include a third driver that receives and inverts the first address decoding signal and applies the inverted signal of the address decoding signal to a gate terminal of the PMOS transistor of the floating driver. The pull-up driver may include a PMOS transistor. The first and second address decoding signals may be one of row addresses or column addresses of a word line of a semiconductor memory device.

A word line driving circuit according to an exemplary embodiment of the inventive concept includes a first inverter inverting a first address decoding signal, a second inverter delaying the first address decoding signal, and a word line voltage supply unit including a pull-up driver that supplies the delayed first address decoding signal to a word line in response to a second address decoding signal. The second inverter includes a PMOS transistor, where a source terminal thereof receives a high voltage, and a gate terminal thereof receives the inverted first address decoding signal, and an NMOS transistor, where a source terminal of the NMOS transistor receives an intermediate voltage between a ground voltage and the high voltage.

The first inverter may include a second PMOS transistor, where a source terminal thereof receives the high voltage and a gate terminal thereof receives the first address decoding signal, and a second NMOS transistor, where a source terminal thereof receives the ground voltage and a gate terminal thereof receives the first address decoding signal. The word line driving circuit may further include a driver that prevents the intermediate voltage from being applied to the word line when the delayed first address decoding signal is at its lowest level. The driver may include a PMOS transistor whose source terminal receives the delayed first address decoding signal and whose gate terminal receives the inverted first address decoding signal. The word line driving circuit may include a third inverter inverting the first address decoding signal and outputting the inverted first address decoding signal to the driver. The third inverter may include a third PMOS transistor, a source terminal thereof receiving the high voltage, a gate terminal thereof receiving the first address decoding signal, and a third NMOS transistor, a source terminal thereof receiving the ground voltage and a gate terminal thereof receiving the first address decoding signal.

A method of driving a word line according to an exemplary embodiment of the present invention includes applying a first address decoding signal at a low level to an input of an inverter chain and applying a voltage to a source terminal of a NMOS transistor of the inverter chain having a voltage between a ground voltage and a high voltage to generate a floating signal, applying the floating signal to a source terminal of a PMOS transistor of a pull-up driver that responds to a second address decoding signal, a drain terminal of the PMOS transistor connected to the a word line, and a gate terminal of the PMOS transistor receiving the second address decoding signal, applying the first address decoding signal at a high level to the input of the inverter chain to generate a word selection signal, and applying the word selection signal to the source terminal of the PMOS transistor whose drain terminal is connected to the word line to select the word line. The word selection signal may have a level that is higher than floating signal. The method may further include applying the first address decoding signal to an input of a second inverter other than the inverter chain and inverter and applying the corresponding inverted signal to the gate terminal of the PMOS transistor whose drain terminal is connected to the word line.

A method of driving a word line according to an exemplary embodiment of the present invention includes floating a PXID signal in a standby state before a word line is selected, inputting a first row address decoding signal at a high level, applying a set voltage that is higher than a ground voltage and lower than a high voltage to a source of an NMOS transistor of a PXID driver, applying the PXID signal to the PMOS transistor of the pull-up driver that responds to a second row address decoding signal to activate the word line, and inputting the first row address decoding signal at a low level to float the PXID signal.

BRIEF DESCRIPTION OF THE DRAWINGS

The present inventive concept will become more apparent by describing in detail exemplary embodiments thereof with reference to the attached drawings in which.

DETAILED DESCRIPTION OF EXEMPLARY EMBODIMENTS

Exemplary embodiments of the inventive concept will now be described more fully with reference to the accompanying drawings. Like numbers refer to like elements throughout the description of the figures. It will be understood that when an element is referred to as being "connected" or "coupled" to another element, it can be directly connected or coupled to the other element or intervening elements may be present.

Hereinafter, a word line driving circuit and method according to exemplary embodiments of the inventive concept will be described in detail with reference to the accompanying drawings.

Figure 1:
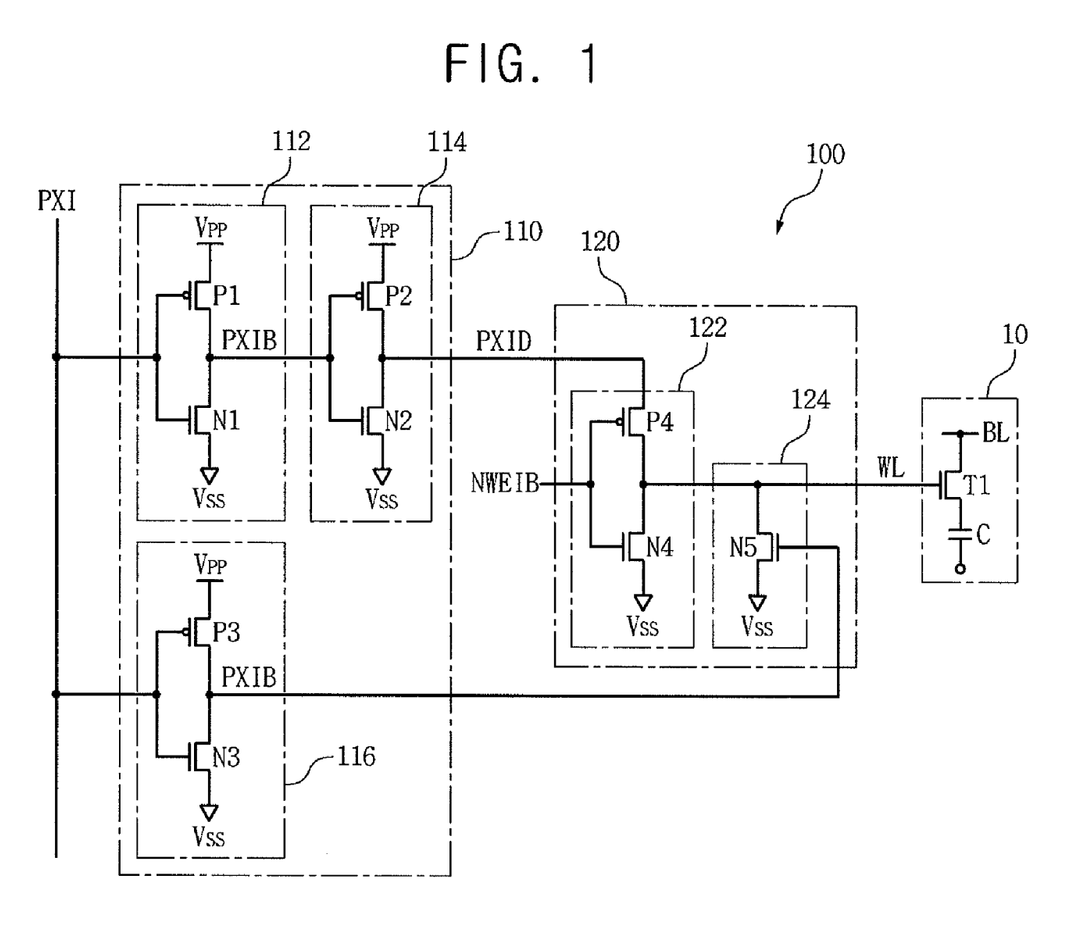
FIG. 1 is a circuit diagram schematically illustrating a word line driving circuit for a DRAM cell.

A word line driving circuit 100 of FIG. 1 supplies a word line voltage to a dynamic random access memory (DRAM) cell 10. The DRAM cell 10 includes a one cell transistor T1 and one cell capacitor C. The drain of the cell transistor T1 is connected to a bit line BL, and the gate thereof is connected to a word line WL. The word line driving circuit 100 supplies a word line voltage through the word line WL.

Referring to FIG. 1, the word line driving circuit 100 includes an address decoding signal generating unit 110 and a word line voltage supply unit 120. The address decoding signal generating unit 110 receives a first address decoding signal (e.g., an upper row address (URA) signal) (hereinafter referred to as a PXI signal), and the word line voltage supply unit 120 receives a second address decoding signal (e.g., a lower row address (LRA) signal) (hereinafter referred to as a NWEIB signal). Alternately the units 100 and 120 may respectively receive first and second column address decoding signals (e.g., upper, lower, etc.)

The address decoding signal generating unit 110 inverts the PXI signal to generate an inverted decoding signal (hereinafter, referred to as a PXIB signal), and delays the PXI signal to generate a delayed decoding signal (hereinafter, referred to as a PXID signal). The address decoding signal generating unit 110 includes a first PXIB driver 112 and a PXID driver 114, forming an inverter chain, and a second PXIB driver 116 that outputs the PXIB signal to the word line voltage supply unit 120.

The first PXIB driver 112 includes a first inverter having a PMOS transistor P1 and an NMOS transistor N1. The first PXIB driver 112 receives the PXI signal and outputs the PXIB signal. The PXIB signal has a phase or level opposite to that of the PXI signal. The PXID driver 114 includes a second inverter having a PMOS transistor P2 and an NMOS transistor N2. The PXID driver 114 receives the PXIB signal and outputs the PXID signal. The second PXIB driver 116 has a PMOS transistor P3 and an NMOS transistor N3, similar to the first PXIB driver 112. The second PXIB driver 116 receives the PXI signal and outputs the PXIB signal. The PXI signal is decoded by row addresses RA0 and RA1 (or column addresses CA0 and CA1).

The word line voltage supply unit 120 includes a pull-up driver 122 and a reset driver 124. The pull-up driver 122 receives the NWEIB signal and supplies the word line voltage to the word line WL. The pull-up driver 122 is a fourth inverter and includes a PMOS transistor P4 and an NMOS transistor N4. The PMOS transistor P4 includes a source terminal to which the PXID signal is input, a gate terminal to which the NWEIB signal is input, and a drain terminal connected to the word line WL. The NMOS transistor N4 includes a source terminal connected to a ground terminal, a gate terminal to which the NWEIB signal is input, and a drain terminal connected to the word line WL.

The reset driver 124 includes one NMOS transistor N5. The NMOS transistor N5 includes a source terminal connected to the ground terminal, a gate terminal to which the PXIB signal is input, and a drain terminal connected to the word line WL.

The PXI signal is set at a high level and the NWEIB signal is set at a low level to supply the word line voltage to the world line WL. When the PXI signal is at a high level, the PXIB signal is at a low level, and thus NMOS transistor N5 of the reset driver 124 is turned off. Therefore, a word line voltage of the word line WL is not discharged through the NMOS transistor N5. The NWEIB signal may be decoded by row addresses RA2 to RAn other than the row addresses RA0 and RA1 (or column addresses CA2 to CAn other than column addresses CA0 and CA1).

A reliability test may be performed on the word line driving circuit 100 of FIG. 1 to test the HEIP of the PMOS transistor of the pull-up driver 122. For example, the level of the PXID signal may be repeatedly changed between a low-level ground voltage Vss and a high-level voltage Vpp. The test can be used to determine an amount of deterioration of the driving circuit 100 by continuously applying pulses to the source of the PMOS transistor P4 while frequently accessing one word line WL. The swing width of the source voltage of the PMOS transistor P4 may be reduced to lessen or prevent the effects of the HEIP. In an exemplary embodiment, the ground voltage Vss is 0 V and the high voltage Vpp is 5.2 V. Since the swing width of the voltage of the PXID signal applied to the PMOS transistor P4 is wide (e.g., 0 V to 5.2 V), a relatively large amount of GIDL current may be generated in a standby state of the word line driving circuit 100. A GIDL phenomenon accompanied with HEIP may occur frequently when the high voltage Vpp is applied to the gate terminal of the PMOS transistor P4 and the low-level ground voltage Vss is applied to the source and the drain terminals.

Figure 2:
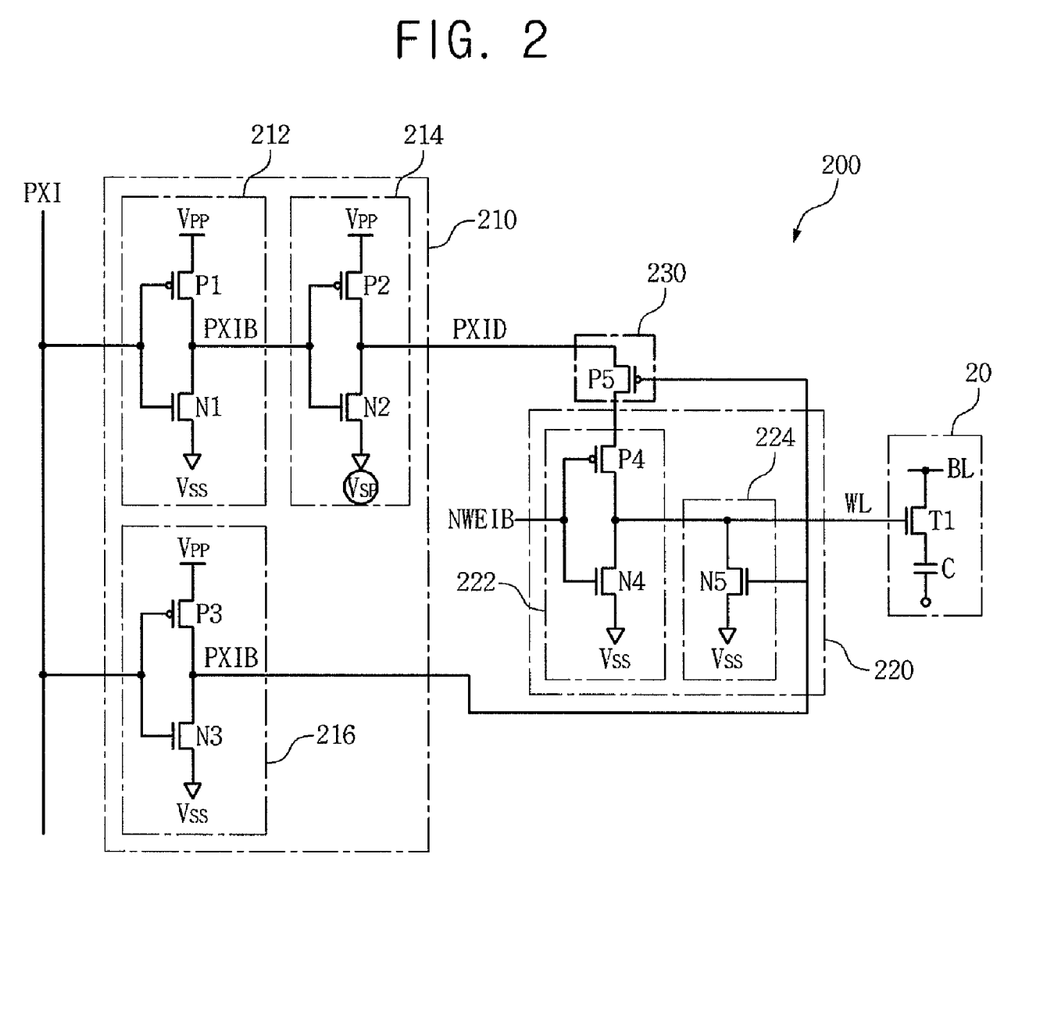
FIG. 2 is a circuit diagram illustrating a word line driving circuit according to an exemplary embodiment of the inventive concept.

FIG. 2 is a circuit diagram illustrating a word line driving circuit according to an exemplary embodiment of the invention. Referring to FIG. 2, a word line driving circuit 200 includes an address decoding signal generating unit 210 and a word line voltage supply unit 220. The word line voltage supply unit 220 has the same structure as that shown in FIG. 1.

The address decoding signal generating unit 210 includes a first PXIB driver 212, a PXID driver 214, and a second PXIB driver 216. The first PXIB driver 212 receives and inverts the PXI signal and outputs a PXIB signal (e.g., an inverted URA signal) to the PXID driver 214. The PXID driver 214 inverts the PXIB signal and outputs the inverted PXIB signal as a PXID signal. For example, the PXID signal is obtained by delaying the PXI signal using the first PXIB driver 212 and the PXID driver 214. The second PXIB driver 216 receives and inverts the PXI signal and outputs the PXIB signal (e.g., an inverted URA signal).

The first PXIB driver 212 and the PXID driver 214 form an inverter chain. The first PXIB driver 212 includes a PMOS transistor P1 and an NMOS transistor N1. In an exemplary embodiment, a high voltage Vpp is applied to the source terminal of the PMOS transistor P1 of the first PXIB driver 212 and a ground voltage Vss is applied to the source terminal of the NMOS transistor N1.

Figure 3:
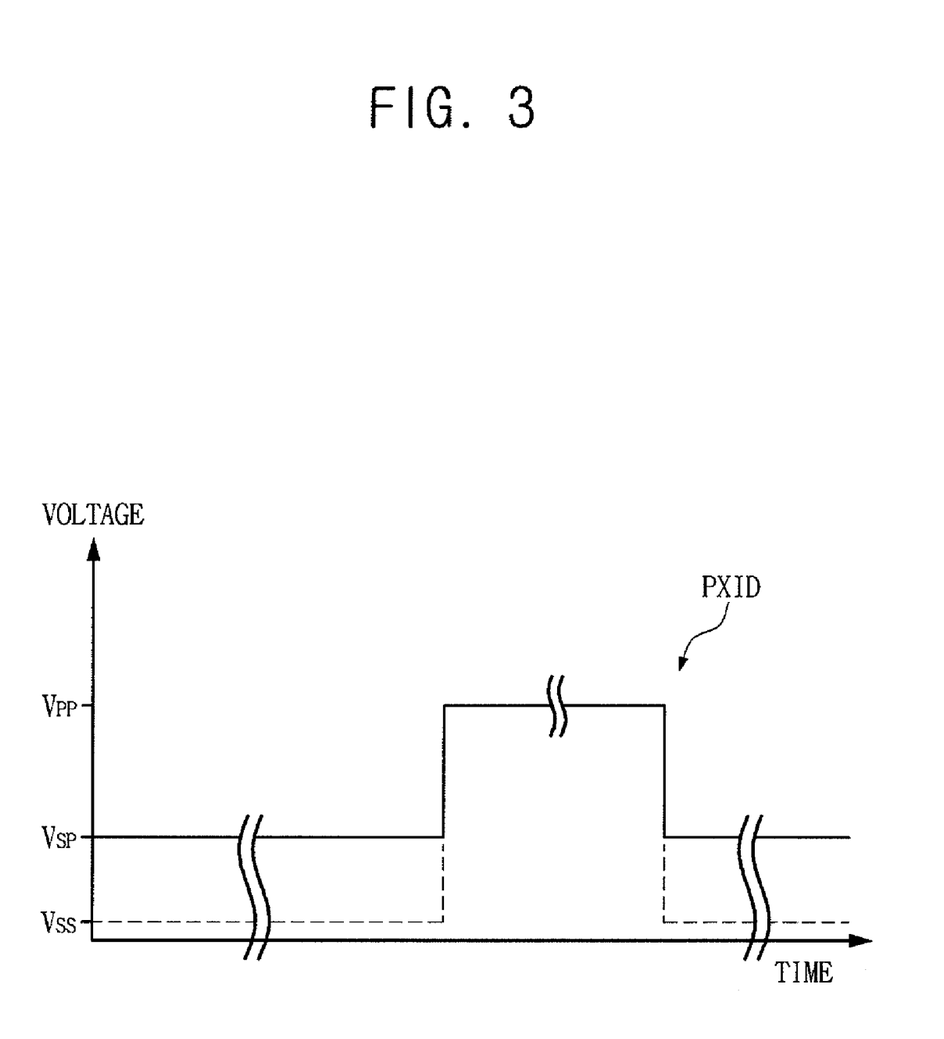
FIG. 3 is a diagram illustrating an exemplary waveform of a PXID signal shown in FIG. 2.

The PXID driver 214 receives the PXIB signal output from the first PXIB driver 212, and outputs a PXID signal having a voltage swing width narrower than the PXID driver 114 shown in FIG. 1. The PXID driver 214 includes a PMOS transistor P2 and an NMOS transistor N2. In an exemplary embodiment, the high voltage Vpp is applied to the source terminal of the PMOS transistor P2, and an arbitrarily set voltage Vsp that is higher than the ground voltage Vss and is lower than the high voltage Vpp is applied to the source terminal of the NMOS transistor N2. Therefore, the voltage of the PXID signal output from the PXID driver 214 swings between the high voltage Vpp and the set voltage Vsp. For example, as shown in FIG. 3, the voltage swing width of the PXID signal output from the PXID driver 214 is narrower than that output from the PXID driver 114.

In an exemplary embodiment of the inventive concept, the set voltage Vsp includes a bit line precharge voltage Vbl or an internal power supply voltage Vint. In an exemplary embodiment, the bit line precharge voltage Vbl is about 0.6 V (e.g., a general-purpose voltage) and the internal power supply voltage Vint is about 1.2 V (e.g., a general-purpose voltage). The bit line precharge voltage Vbl and the internal power supply voltage Vint may be globally used in a memory core area, and may be used as the set voltage Vsp applied to the source of the NMOS transistor N2.

In a word line driving circuit according to at least one exemplary embodiment of the inventive concept, a set voltage Vsp higher than the ground voltage Vss is applied to the source of the NMOS transistor N2 of the PIXD driver 214 to reduce the voltage swing width of the PIXD signal. In this way, the effects of the HEIP on the PMOS transistor P4 of the pull-up driver 222 may be reduced or prevented.

The word line driving circuit 200 further includes a floating driver 230 that is used to prevent the set voltage Vsp from being applied to the word line WL when the PXID signal is at a low level. The floating driver 230 receives the PXIB signal, which is an inverted signal of the PXID signal, and floats the PXID signal to be applied to the word line WL. The floating signal may be represented by an intermediate level between a high and a low logical level. The floating driver 230 includes a PMOS transistor P5 having a gate terminal connected to the second PXIB driver 216, and a source terminal and a drain terminal respectively connected to the PXID driver 214 and the word line voltage supply unit 220. For example, in a sub word line driver, the floating driver 230 may float three sub word lines among four sub word lines sharing the NWEIB signal, and may apply the PXID signal to the remaining sub word line.

Figure 4:
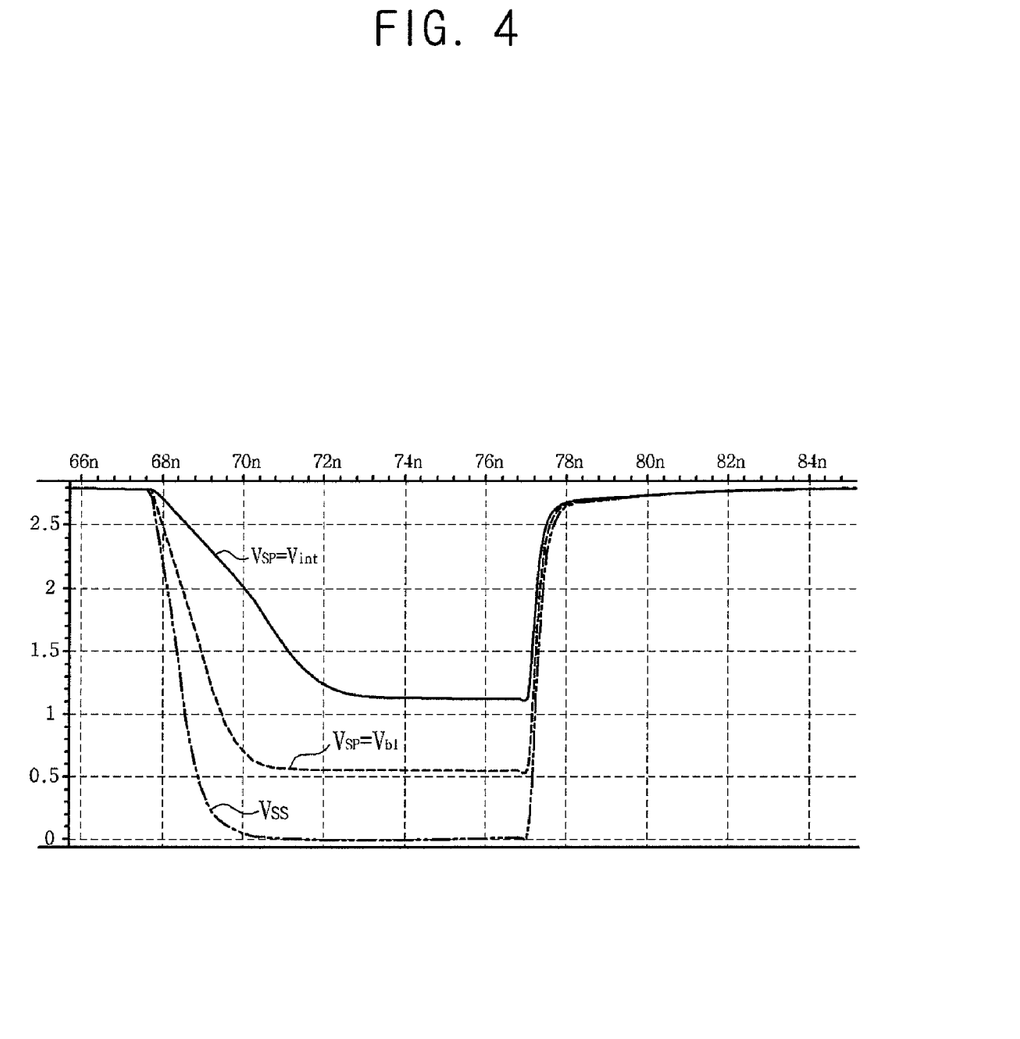
FIG. 4 is a graph illustrating an exemplary waveform of a signal according to a set voltage applied to a source of an NMOS transistor of a PXID driver.

FIG. 4 is a graph illustrating an exemplary waveform of the PXID signal according to the set voltage Vsp applied to the source of the NMOS transistor N2 of the PXID driver 214. As shown in FIG. 4, the low-level voltage of the PXID signal depends on the set voltage Vsp. In an exemplary embodiment, the set voltage Vsp is the bit line voltage Vbl or the internal power supply voltage Vint, and is lower than the ground voltage. In addition, the magnitude of the gradient of a falling section of the PIXD signal when a set voltage Vsp higher than the ground voltage Vss is applied is smaller than that when the ground voltage Vss is applied. Therefore, the effects of HEIP may be removed or reduced (e.g., minimized).

A result according to the set voltage Vsp from an enable signal output to the word line WL may be determined. In at least one exemplary embodiment of the inventive concept, a variation in the enable signal applied to the word line WL may be checked using an RAS to CAS delay time (tRCD) and a row precharge time (tRP). The tRCD is the time from a constant specific signal (hereinafter, referred to as S1) to a half level when the voltage of the word line WL rises, and the tRP is the time from S1 to a half level when the voltage of the word line WL falls.

Figure 5:
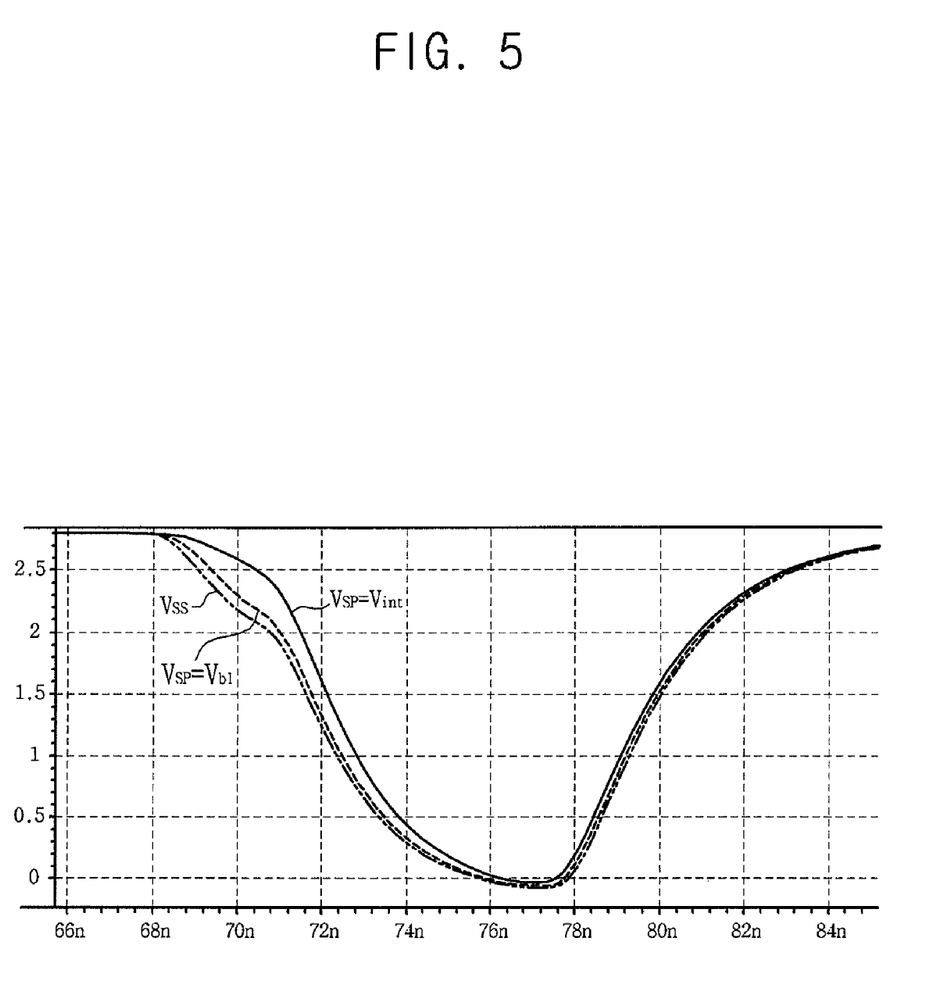
FIG. 5 is a graph illustrating an exemplary waveform of an enable signal output to a word line according to the set voltage.

FIG. 5 is a graph illustrating an exemplary waveform of the enable signal output to the word line WL according to the set voltage Vsp. In a word line driving circuit according to an exemplary embodiment of the inventive concept, if the bit line voltage Vbl is used as the set voltage Vsp, the tRCD of the word line enable signal decreases by about 1.5% and the tRP thereof increases by about 5.4%, which differs from the word line driving circuit of FIG. 1. Even if the internal power supply voltage Vint is used as the set voltage Vsp, variations in the word line enable signal are not large. Therefore, either the bit line voltage Vbl or the internal power supply voltage Vint may be used as the set voltage Vsp.

Figure 6:
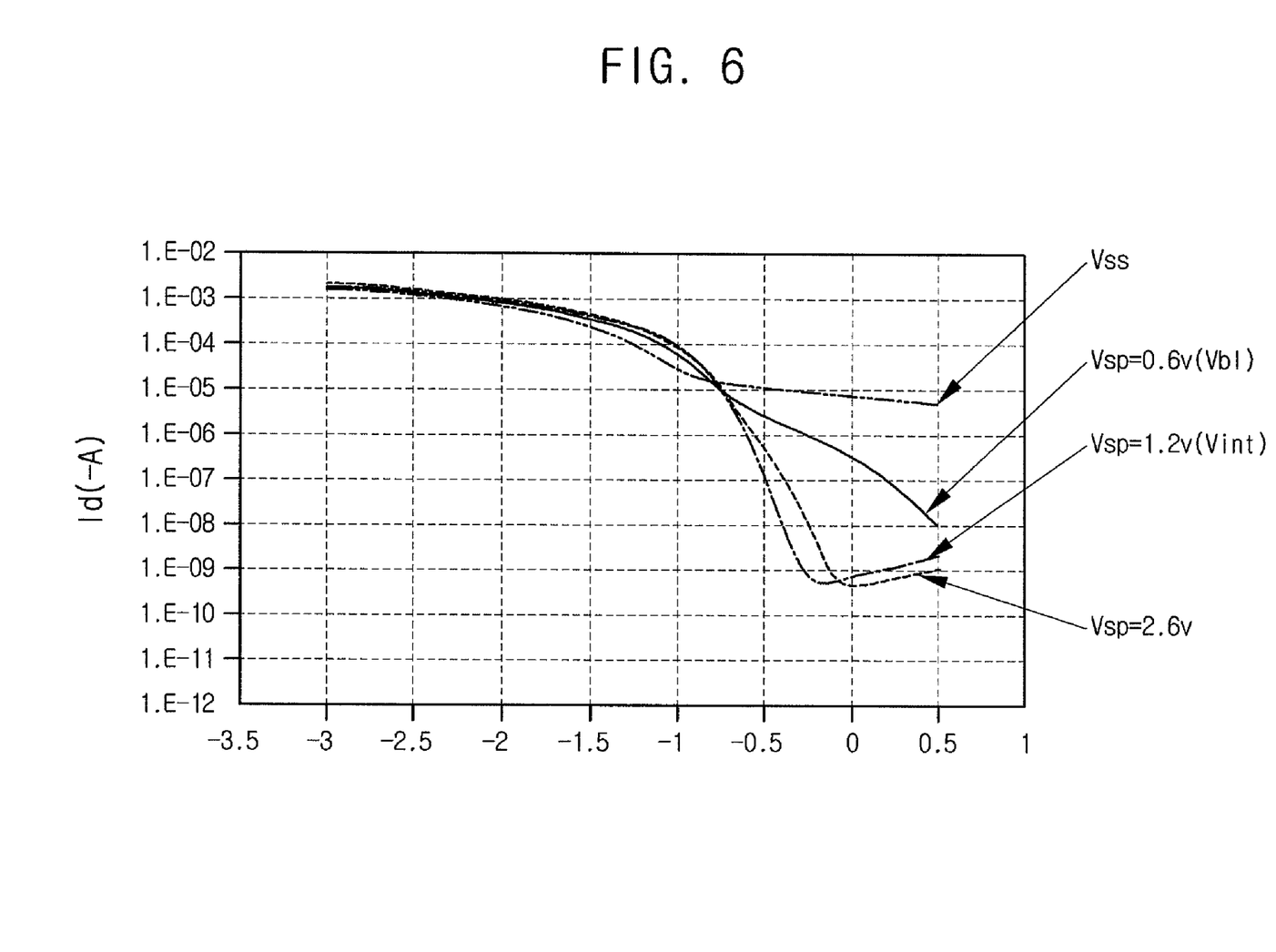
FIG. 6 is a graph illustrating exemplary current flowing through a pull-up PMOS transistor according to the swing width of the PXID signal in a log scale.

FIG. 6 is a graph illustrating exemplary current of the PMOS transistor P4 according to the voltage swing width of the PXID signal when an AC pulse of an actual operation environment is applied to the PMOS transistor P4 of the pull-up driver 222. As shown in FIG. 6, as the voltage swing width of the PXID signal applied to the source of the PMOS transistor P4 of the pull-up driver 222 decreases, a variation in the current of the PMOS transistor P4 becomes large. Referring to FIG. 6, when the bit line voltage Vbl of 0.6 V is applied as the set voltage Vsp, a drain current at a gate voltage of 0V is reduced by about 1.4 orders of magnitude as compared to that when the ground voltage Vss is applied. When the internal power supply voltage Vint of 1.2V is applied as the set voltage Vsp, the drain current at the gate voltage of 0 V is reduced by about 4 orders of magnitude as compared to that when the ground voltage Vss is applied. When the set voltage Vsp is 2.6 V, the drain current at the gate voltage of 0 V is reduced by about 4.2 orders of magnitude as compared to that when the ground voltage Vss is applied. Consequently, if the set voltage is applied, the leakage current when the PMOS transistor P4 is turned off is reduced or rarely occurs.

A word line driving circuit according to at least one exemplary embodiment of the inventive concept may reduce the voltage swing width of the PXID signal applied to the pull-up driver 222 to reduce the effects of or prevent the GIDL phenomenon of the PMOS transistor P4.

Figure 7:
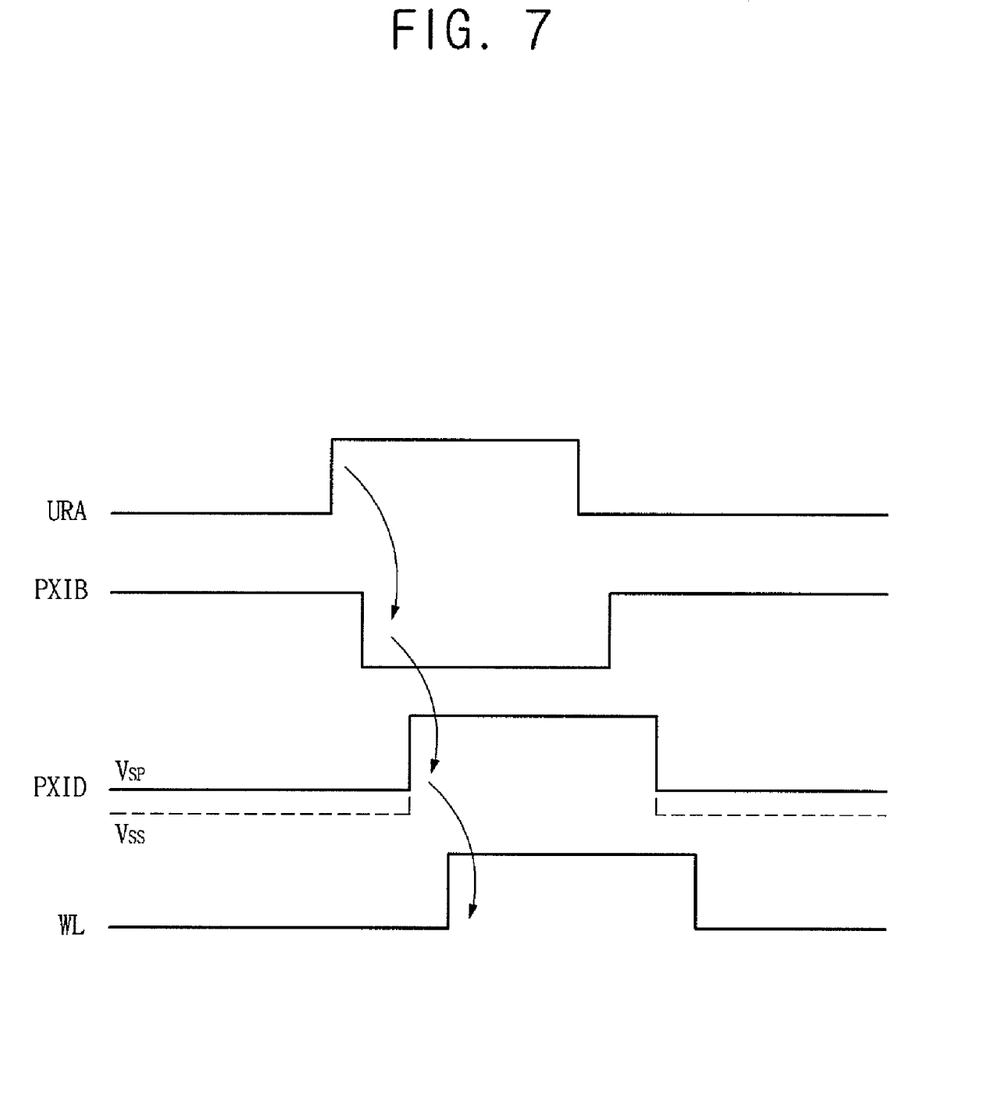
FIG. 7 is a timing chart illustrating an exemplary operation of the word line driving circuit shown in FIG. 2.

FIG. 7 is a timing chart illustrating an exemplary operation of the word line driving circuit shown in FIG. 2. Referring to FIG. 7, the PXID signal is activated by the URA signal (e.g., the PXI signal), and the word line WL is activated by the PXID signal.

Before the URA signal is applied, the PXID signal is at the low level of the set voltage Vsp that is higher than the ground voltage Vss and lower than the high voltage Vpp to reduce the voltage swing level of the PXID signal. When the PXID signal is at the low level of the set voltage Vsp, since a high-level PXIB signal is present, the PXID signal is in a floating state (e.g., between a logical low level and a logical high level) without being transmitted to the word line WL through the floating driver 230. Therefore, a GIDL current is not generated in the source of the PMOS transistor P4 of the pull-up driver 222.

After the URA signal transitions to a high level, the PXIB signal transitions to a low level, followed by the PXID signal transitioning to the high voltage Vpp, and the signal of the word line WL transitioning to a high level. In this example, the voltage swing width of the PXID signal is narrower than that of the signal of the word line. Since the voltage swing width of the PXID signal applied to the source of the PMOS transistor P4 of the floating driver 230 is narrow, the effects of HEIP may be reduced or prevented.

After the URA signal transitions to a low level, the PXIB signal transitions to a high level, followed by the PXID signal transitioning to the set voltage Vsp, and the signal of the word line transitioning to a low level. When the PXID signal transitions to the set voltage Vsp higher than the ground voltage Vss, the voltage swing width of the PXID signal is narrow. Therefore, a method of driving the word line according to an exemplary embodiment of the inventive concept can reduce the voltage swing width of the PXID signal and reduce the effects of or prevent the GIDL phenomenon.

The word line driving circuit 200 according to the exemplary embodiment shown in FIG. 2 may be applied to a word line driving circuit having a sub word line driver structure.

While the exemplary embodiments of the inventive concept have been shown and described with reference to the drawings, it will be understood by one of ordinary skill in the art that various changes in form and details may be made therein without departing from the spirit and scope of the disclosure.

What is claimed is:

1. A word line driving circuit comprising:
an address decoding signal generating unit including an inverter chain, the inverter chain receiving and delaying a first address decoding signal and outputting the delayed first address decoding signal; and
a word line voltage supply unit including a pull-up driver that supplies the delayed first address signal to a selected word line in response to a second address decoding signal,
wherein the inverter chain includes a first inverter connected in series with a second inverter,
wherein a source terminal of a first NMOS transistor of the first inverter receives a ground voltage,
wherein a second NMOS transistor of the second inverter outputs the delayed first address signal, and a source terminal of the second NMOS transistor receives a set voltage that is higher than the ground voltage and lower than a high voltage.

2. The word line driving circuit of claim 1, wherein the inverter chain includes a PMOS transistor and a source terminal of the PMOS transistor receives the high voltage.

3. The word line driving circuit of claim 1, wherein the set voltage includes one of a bit line voltage or an internal power supply voltage.

4. The word line driving circuit of claim 1, wherein the inverter chain includes:
a first driver receiving and inverting the first address decoding signal and outputting the inverted signal of the first address decoding signal; and
a second driver receiving and inverting the inverted signal of the first address decoding signal to output the delayed first address decoding signal.

5. The word line driving circuit of claim 4, further comprising: a floating driver applying the delayed first address decoding signal to the word line voltage supply unit in response to the inverted signal of the first address decoding signal.

6. The word line driving circuit of claim 5, wherein the address decoding signal generating unit further includes a third driver that receives and inverts the first address decoding signal and applies the inverted signal of the first address decoding signal to the floating driver.

7. The word line driving circuit of claim 5, wherein the floating driver includes a PMOS transistor.

8. The word line driving circuit of claim 7, wherein the address decoding signal generating unit further includes a third driver that receives and inverts the first address decoding signal and applies the inverted signal of the address decoding signal to a gate terminal of the PMOS transistor of the floating driver.

9. The word line driving circuit of claim 1, wherein the pull-up driver includes a PMOS transistor.

10. The word line driving circuit of claim 1, wherein the first and second address decoding signals are one of row addresses or column addresses of a word line of a semiconductor memory device.

11. A word line driving circuit comprising:
a first inverter inverting a first address decoding signal;
a second inverter delaying the first address decoding signal;
a word line voltage supply unit including a pull-up driver that supplies the delayed first address decoding signal to a word line in response to a second address decoding signal; and a driver that prevents the intermediate voltage from being applied to the word line when the delayed first address decoding signal is at its lowest level, wherein the second inverter comprises:
- a PMOS transistor, a source terminal thereof receiving a high voltage, and a gate terminal thereof receiving the inverted first address decoding signal; and
- an NMOS transistor, a source terminal of the NMOS transistor receiving an intermediate voltage between a ground voltage and the high voltage.

12. The word line driving circuit of claim 11, wherein the first inverter comprises:
- a second PMOS transistor, a source terminal thereof receiving the high voltage and a gate terminal thereof receiving the first address decoding signal; and
- a second NMOS transistor, a source terminal thereof receiving the ground voltage and a gate terminal thereof receiving the first address decoding signal.

13. The word line driving circuit of claim 11, wherein the driver comprises a PMOS transistor whose source terminal receives the delayed first address decoding signal and whose gate terminal receives the inverted first address decoding signal.

14. The word line driving circuit of claim 13, further comprising a third inverter inverting the first address decoding signal and outputting the inverted first address decoding signal to the driver.

15. The word line driving circuit of claim 14, wherein the third inverter comprises:
- a third PMOS transistor, a source terminal thereof receiving the high voltage, a gate terminal thereof receiving the first address decoding signal; and
- a third NMOS transistor, a source terminal thereof receiving the ground voltage and a gate terminal thereof receiving the first address decoding signal.

16. A word line driving circuit comprising:
- an address decoding signal generating unit including an inverter chain, the inverter chain receiving and delaying a first address decoding signal and outputting the delayed first address decoding signal;
- a word line voltage supply unit including a pull-up driver that supplies the delayed first address signal to a selected word line in response to a second address decoding signal; and
- a floating driver, wherein the inverter chain includes an NMOS transistor outputting the delayed first address signal, and a source terminal of the NMOS transistor receives a set voltage that is higher than a ground voltage and lower than a high voltage, wherein the inverter chain further comprises:
- a first driver receiving and inverting the first address decoding signal and outputting the inverted signal of the first address decoding signal; and
- a second driver including the NMOS transistor and receiving and inverting the inverted signal of the first address decoding signal to output the delayed first address decoding signal, and wherein the floating driver applies the delayed first address decoding signal to the word line voltage supply unit in response to the inverted signal of the first address decoding signal.

* * * * *